April 29, 1958 W. R. KEARNEY 2,832,889

SIGNAL SEEKING RADIO CONTROL

Filed Nov. 17, 1953 2 Sheets-Sheet 1

INVENTOR
William R. Kearney
BY R. E. Fowler
ATTORNEY

April 29, 1958 W. R. KEARNEY 2,832,889

SIGNAL SEEKING RADIO CONTROL

Filed Nov. 17, 1953 2 Sheets-Sheet 2

INVENTOR
William R. Kearney
BY R. E. Fowler
ATTORNEY 2,832,889

SIGNAL SEEKING RADIO CONTROL

William R. Kearney, Kokomo, Ind., assignor to General Motors Corporation, Detroit, Mich., a corporation of Delaware Application November 17, 1953, Serial No. 392,587

11 Claims. (Cl. 250—40)

Figure 1:
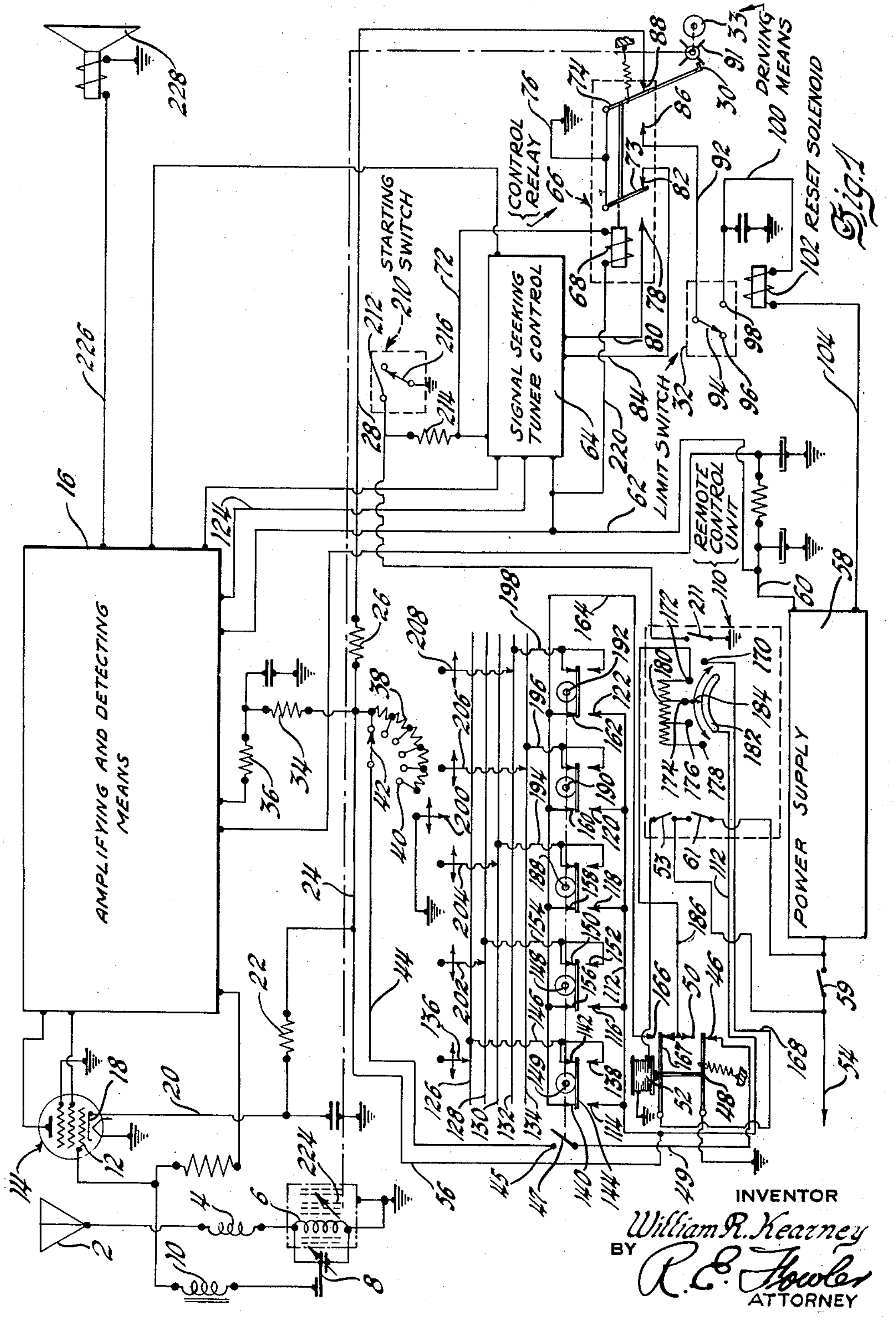

This invention relates to tuning means for radio apparatus and more particularly to automatic means for tuning, actuated to index by the reception of an incoming signal in the receiver. This type of tuner has been called "stop-on-signal" or "signal-tuned." In this tuner driving means are provided to cause the tuner to scan the frequency band of the receiver, and when a signal is tuned in, stopping means is actuated to stop or index said tuner. Closure of a manual switch causes the tuner to proceed across the band and it will then stop on the next received station signal. In that type of tuner the stations are tuned in in sequence across the band. In most of these tuners the stopping and indexing is accomplished during one direction of travel, the return stroke being accomplished quickly, and immediately causing scanning to start again from the same end. Most of these tuners provide for indexing or stopping on station when tuning from the low frequency toward the high frequency end of the band.

If the operator desires to receive a station transmitting at a lower frequency than that to which he is listening, he must cause the tuner to proceed completely to the high frequency end where it will quickly return to the low frequency end, and then advance toward the desired station. This is accomplished by merely holding down the manual control switch so that no incoming stations will cause the tuner to stop. The operator must, however, watch the dial, and when the tuner approaches the desired station frequency, release the manual switch and the tuner will then stop on the first station signal thereafter received by the receiver. Thus, when any particular station is desired, the attention of the operator is necessary to bring the tuner into the approximate location of the station, and then permit the signal seeking action to take over.

A combination form of tuner has bene devised which provides not only for the signal seeking tuning action, but also has a plurality of push buttons, the operation of any one of which causes the tuner to go directly to a prescribed station. This might be called a combination signal seeking and favorite station tuner, and such tuner is disclosed and claimed in a copending application Serial No. 268,859, filed January 29, 1952, in the name of Bertram A. Schwarz, now Patent 2,744,193, issued May 1, 1956. The type of tuner described in this copending application is designed to have the tuning means located within the casing of the receiver in a compact unit. However, especially in automobile receivers, remote control operation is in some instances desirable, and may in the near future be required due to mounting various equipment under the instrument panel of the car.

It is therefore an object in making this invention to provide remote control signal seeking tuning means.

It is a further object in making this invention to provide a favorite station signal seeking tuning system which can be operated in a modified manner from a remote point.

It is a further object in making this invention to provide a favorite station, signal seeking tuner with remote control means so that it may be operated from a remote point as a sequence tuner for preselected stations.

It is a still further object in making this invention to provide means to facilitate the setting up of the favorite station portion of a signal seeking tuner.

It is a still further object in making this invention to provide audible means for indicating the in-tune position of the favorite station switches.

Figure 2:
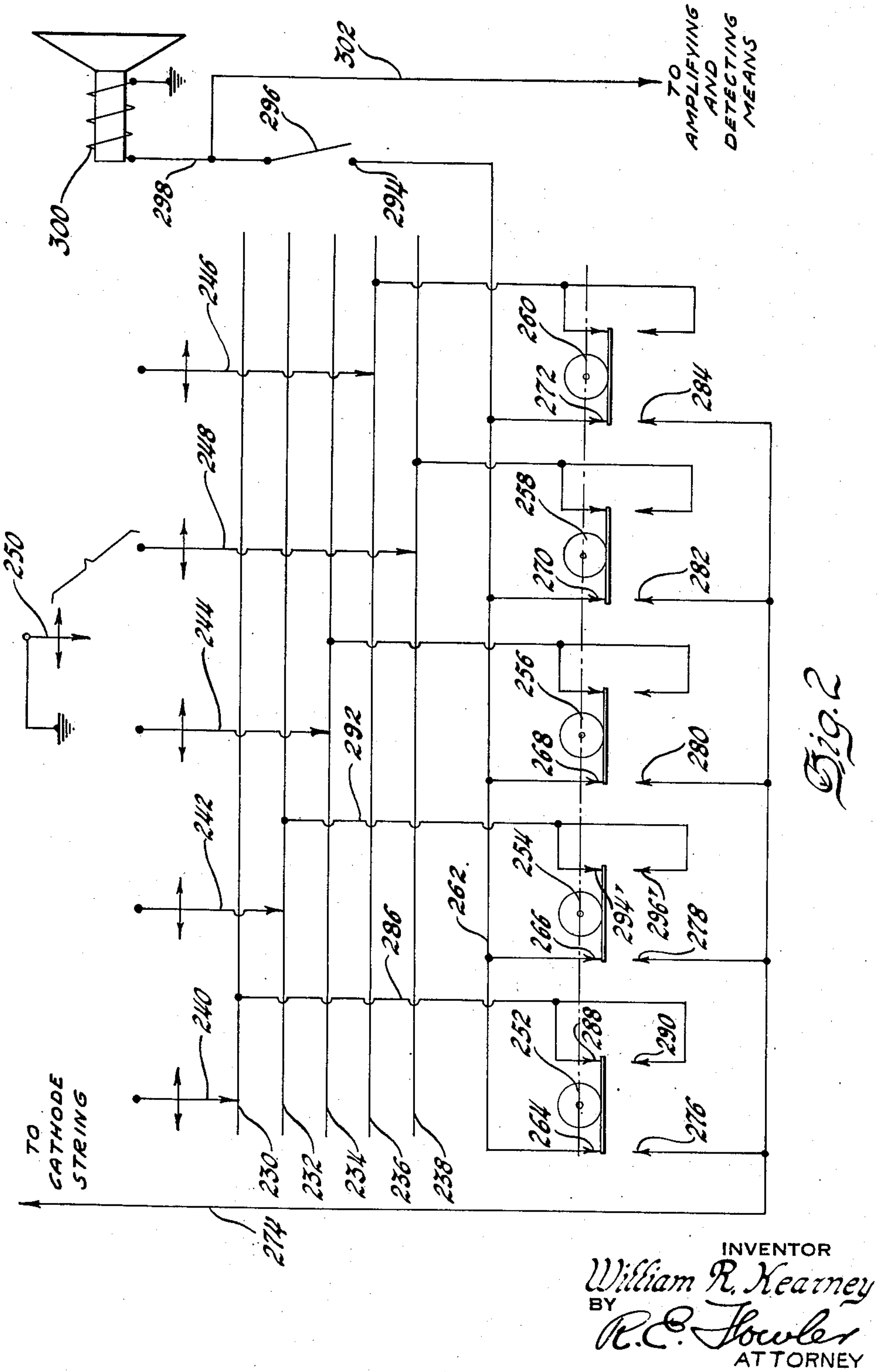

With these and other objects in view which will become apparent as the specification proceeds, my invention will be best understood by reference to the following specification and claims and the illustrations in the accompanying drawings, in which:

Figure 1 is a circuit-block diagram of a signal seeking, favorite station tuner embodying my invention; and Figure 2 is a partial circuit diagram showing the circuitry for facilitating setting up the favorite station push buttons.

Referring now more specifically to Figure 1, there is shown therein a radio receiver having an antenna 2 connected directly to an inductance coil 4 in series with a tunable inductance 6, the opposite terminal of which is grounded. An adjustable coupling condenser 8 is connected across the tuning inductance 6 and also to a choke coil 10, the opposite terminal of which is connected to the control grid 12 of an R. F. amplifier tube 14. The output of the radio frequency amplifier tube 14 feeds directly into the amplifying and detecting portion of the receiver which is conventional and is shown by the block 16, so labelled. The cathode 18 of the radio frequency amplifier tube 14 is connected through line 20 to a resistor 22, the opposite terminal of which is connected through line 24 with a further resistor 26. Line 24 is also connected to one terminal of a resistor 34, which is connected in series with a second resistance 36 to the cathode string of the I. F. amplifier tubes in section 16. The two resistors 22 and 26, in combination with resistors 34 and 36 in the I. F. section, determine the sensitivity of the receiver under certain conditions. Resistor 26 has its remote terminal connected through line 28 to stationary contact 88 of a solenoid operated relay switch 66.

Line 24 is connected to one terminal of a tapped resistor 38 which forms a potentiometer or rheostat and has a series of stationary contacts 40 connected to the taps of the resistor and over which a movable rotatable arm 42 may move in order to incorporate in or remove resistance from the circuit. Movable arm 42 is connected through a conductor 44 to a stationary contact 45. Switch arm 47 engages contact 45 and is connected through line 49 with relay contact 46. Contact 46 is engaged by movable armature 48, which is grounded and moves between stationary contact 46 and a further stationary contact 50, its position being determined by a relay coil 52 controlled by a remote switch 53 located in the remote control unit 110. Switch arm 47 is normally in engagement with contact 45, but when any of the favorite station buttons are depressed, it is opened. This is indicated by the dotted line connection.

The receiver is provided with an incoming power line 54 from the conventional battery through a main on-off switch 59. The power supply section feeds a power supply section 58 which may be of the conventional vibrator type to change the low voltage into the necessary high voltage for the various electronic means. The output of the power supply is connected through line 60 and tie line 62 connected therewith to the amplifying and detecting means and also to that portion of the tuning means indicated by the block 64 which incorporates electronic means for controlling the energization of control relay 66 upon the development of a signal in the amplifying and detecting means 16.

The control relay 66 consists of an operating coil 68 which is connected to the signal seeking tuner means 64 through line 72 and to power supply line 62 through tie line 220. The relay 66 has a pair of movable armatures 73 and 74 which move in unison and are grounded through connection 76. Armature 73 moves between stationary contact 78 connected through line 80 with control unit 64 and stationary contact 82 likewise connected through a similar line 84 with the unit 64 to control the same. Movable armature 74 at the same time moves between two stationary contacts 86 and 88. Contact 88 is connected to line 28 as previously described. Contact 86 is connected through line 92 with movable arm 94 of switch 32. This arm 94 oscillates between a stationary contact 96, unattached, and stationary contact 98, connected through line 100 with one terminal of a solenoid coil 102, the other terminal of the coil being connected through line 104 with the power supply 58. Switch arm 94 acts as a limit switch and is operated mechanically by the tuner movement and solenoid 102 physically moves the tuner to the opposite end of travel when energized. Arm 74 is elongated and has a flanged end 30 that moves into engagement with driving means 33 to stop the tuner on station when the relay is deenergized. The tuner drive is indicated by the dash and dot line between tuning coil 6 and driving means 33. A stopping pulse is developed in the amplifying system 16 and applied through line 124 to the signal seeking tuner control 64 which in turn deenergizes the relay 66 to stop on station.

The switching means which is settable for the different preset favorite stations is shown diagrammatically in the left central section of the circuit diagram including the series of parallel conductive wires and the various switching means associated therewith. These switching means consist of a plurality of parallel conductive lines 126, 128, 130, 132 and 134, each of which is insulated from the others and arranged in parallel relationship along the path of the indicator or pointer of the receiver diagrammatically indicated at 200. Slidably engageable individually with each of these conductors is an assembly such as 136, 202, 204, 206 and 208, each of which has a conductive portion sliding over the associated conductor (indicated by the arrow at the lower end) and a manually engageable part which can be used to move it along the length of the conductor (indicated by the crossed double ended arrow). Each also has an exposed conducting part which engages the pointer as the latter moves past to complete a grounding circuit, which is indicated by the enlarged dot at the upper end.

Below the conductors 126 through 134 inclusive is a series of switches which are spring biased to normally maintain two stationary upper contacts closed but which may upon movement of push buttons connected thereto lock in to close the circuit between two other contacts. Thus, when any one of the switches is pushed in and locked, a particular station is tuned in by the tuner, as will be later described in detail. The first switch 149 consists of two lower stationary contacts 114 and 138 and two upper stationary contacts 140 and 142. Between these double sets of contacts moves the armature 144, normally biased to the upper position as shown, but which can be moved to and locked mechanically to bridge the gap between the two lower contacts 114 and 138. Contacts 138 and 142 are commonly connected through line 146 with trolley conductor 126. In the second push button switch 148, contacts 150 and 152 are connected through line 154 with trolley conductor 128, and contact 156 along with contact 140 of the first switch, 158 of the third, 160 of the fourth, and 162 of the fifth are all connected to a line 164. This line extends to a stationary contact 166 of a second section of a switch actuated by solenoid 52 including a movable armature 167. The armature is connected to a stationary contact 170 of a remote control unit 110 through line 168.

This control also has a plurality of other stationary contacts 172, 174, 176 and 178 across which a tapped resistor 180 is connected. Below the contacts 170, 172, 174, 176 and 178, which are arranged in arcuate manner, is a single spaced arcuate continuous contact 182 which is directly connected to line 112 extending to one of the lower stationary contacts of each favorite station switch at 114, 116, 118, 120 and 122. A movable bridging contact 184 is supported to follow an arcuate path connecting any one of the desired contacts 170, 172, 174, 176, 178 with contact 182, dependent upon its position. Stationary contact 50, engageable by armature 48, is connected through line 186 with stationary contact 172 of the remote control switch and to one end of the resistor 180.

Each of the remaining favorite station switches 188, 190 and 192 has a pair of spaced contacts commonly connected through lines 194, 196 and 198 with trolley conductors 130, 134, and 132 respectively. The indicating pointer for the receiver indicated diagrammatically at 200 is grounded and can, of course, move over the full dial. In following this path it is engageable with each one of the adjustable tabs slidable along the conductors, such as 136, 202, 204, 206 or 208.

A single-pole, double-throw switch 210 located at the receiver is provided for locally initiating normal signal seeking tuning. This switch consists of a stationary contact 212 connected through a resistor 214 to the signal seeking tuning control 64 in which a pulse causes indexing. A movable switch arm 216 is connected to ground and is adapted to engage contact 212 in one position. Line 112 is also connected by tie line 56 with the cathode line 24.

The remote control unit 110 may be located at any desired point. It consists of a remote adjustable sensitivity control 184, an on-off switch 61 connected in parallel to the main on-off switch 59 that enables the energization of the receiver, a remote-local switch 53 controlling relay coil 52 and a further separate switch 211 connected in parallel to switch 210, that upon closing completes a circuit to the relay coil 68 to provide normal signal seeking tuning from the remote point similar to the action of switch 210 at the set. The dash and dotted rectangle adjacent tuning coil 6 diagrammatically discloses the iron core tuning means at 224.

In general, therefore, the system as disclosed consists of a conventional radio frequency and intermediate frequency amplifying means, detector and audio frequency amplifying means, the output of which is fed through line 226 to a loud speaker 228 and sounds are reproduced when the tuning means is tuned to a particular station. Signal seeking tuner means is provided which causes operation of the control relay 66, the coil 68 being energized during tuning action and deenergized when the set is on station. The indexing of the tuner is controlled by a pulse developed in the amplifying and detecting means 16 and fed to the signal seeking tuning control 64 through line 124. When the tuner has reached an extremity of travel, the switch 32 is mechanically thrown from the position shown to its right-hand position by physical engagement of parts (not shown) to cause the energization of coil 102 through an obvious circuit, which returns the carriage to its opposite extremity, at which point the switch 32 is returned to the position as shown on the drawing by physical engagement and the tuner proceeds. Thus, switch 32 is a limit switch for causing solenoid 102 to return the tuning means to its opposite extremity. Power is supplied to the system through power supply 58. Favorite station selection at the receiver is provided through the various switches 148, 149, 188, 190, and 192, in combination with the adjustable tabs 136, 202, 204, 206, and 208, and normal signal seeking tuning is initiated and accomplished through closure of switch 210.

The remote control unit 110 includes potentiometer 182, 184, contact 170 and other on-off and initiating switches at any location desired, and is connected to the main unit through a cable of suitable length. There is, however, one basic difference between the operation of the favorite station portion of the signal seeking tuner when controlled locally and when controlled remotely. If tab 206 has been adjusted so that a particular station will be received when the indicating arm 200 engages it, and its associated push button switch 190 has been depressed, on local operation no other station will be received as the signal seeking tuner control has been rendered insensitive except at the locality of that particular station. The tuner will, therefore, upon depression of button 190 proceed to this station and will not stop at any other. The same would be true of any other favorite station switch.

However, on remote control it would be necessary to have a very large number of wires interconnecting the set and the remote control if the same operation were to be obtained, but with a relatively small number of wires the favorite station portion of the tuner can be made to operate as a sequence tuner, bringing in only those preset stations in a sequential order across the band. In other words, the first time the remote favorite station switch is operated, depending upon the momentary location of the tuner, the station set up by adjustable tab 202 might be tuned in, and the next time the control switch was closed, the tuner would move on to the station set up by tab 204 and proceed in sequence across the band. Ordinary signal seeking tuning is accomplished by its own separate remote switch.

With this general background, therefore, it is now desired to specifically describe the operation of the tuner, first for local operation. Assuming that the receiver is tuned to a particular station, the pulse developed by the incoming signal will have caused deenergization of relay coil 68 so that the switch arms 73, 74 will be released and in the position shown, since the spring bias will force them to this point. This locks the tuning means 33 on station. It will be noted that at that instant the sensitivity of the radio frequency portion of the receiver is determined by resistance 22 in series with the parallel connection of resistor 26 and sensitivity control 38 between cathode 18 and ground. The sensitivity of the IF amplifier is determined by resistors 36 and 34 in series with the same parallel connection between the cathodes of the IF amplifier and ground. This grounding circuit for the cathode 18 is as follows: cathode 18, line 20, resistor 22, line 24, resistor 26, line 28, contact 88, arm 74, line 76, to ground, or from line 24, rheostat 38, arm 42, line 44, switch 45—47, line 49, contact 46, and armature 48 to ground.

If the operator desires to utilize signal seeking tuning, he depresses the local switch 210, which completes a circuit to energize relay coil 68 from line 220 extending from the power supply. This circuit may be traced from line 220, coil 68, resistor 214, contact 212, switch arm 216, to ground. Thus energized, relay coil 68 attracts its armatures 73 and 74 so that they break contact with their stationary contacts 82 and 88 respectively and complete new circuits with stationary contacts 78 and 86. This breaks the grounding circuit for line 28 when armature 74 moves away from contact 88. It likewise unlocks the tuning means and permits it to scan the band. The sensitivity of the amplifiers during tuning is controlled by the setting of the arm 42. The tuner drive then moves the tuning means at a predetermined rate and the switch 210 may be released after a short period, but the relay 68 is maintained energized through electronic control means in the signal seeking tuner means 64. When the tuning means moves to such a position that a signal is tuned in, the signal seeking tuner control means 64 deenergizes the relay coil 68 which releases its armatures 73 and 74 to return to their original position, restoring the original sensitivity of the receiver and stopping the tuner on station. Each time, therefore, that the switch 210 is operated, the tuner will move on to the next adjacent station in the direction of drive.

If it is now desired to set up the various favorite station switches such as switch 149 to receive a particular station, that station is tuned in by normal signal seeking operation of the signal seeking tuner just described. When the desired station for switch 149 is heard on the set, the tab 136 is slid along its conductor 126 until it is directly under the indicating needle 200 and makes physical contact therewith. This is its correct setting to bring in that station whenever this button is depressed. Then when he tuner moves to some other point, if switch 149 is operated the tuner will automatically return to the set position of the tab 136 without stopping at any other station. The reason for this movement is that in no other position is there any circuit completed to ground for the cathode string, and therefore the whole set is incapable of producing a pulse which will stop the tuner. The grounding line 44 is broken at 45—47 when any of the favorite station buttons are depressed and when the tuner starts to move grounding circuit 28 is opened as before described. However, upon engagement of the indicating pointer 200 with the tab 136, a grounding circuit is completed from line 56, line 112, one of the switches such as 149, line 146, trolley 126, contact 136, indicator 200 to ground, and this permits a control pulse to be generated and amplified to deenergize relay coil 68 and immediately the tuner stops on the received station. Thus, each time one of the switches 149, 148, 188, 190, or 192 is depressed and lock in so that its armature bridges the two lower contacts, the switch 45—47 is opened and the tuner will not stop until the indicating needle 200 aligns itself with the associated tab for those switches which have been preset for particular stations. There is thus provided by the previously described means either straight signal seeking tuning or favorite station tuning to the particular stations whose locations are determined by the locations of the adjustable tabs 136, 202, 204, 206 and 208.

In the operation of the tuning means from a remote point, the control unit 110 is located at such position. As previously indicated, there are also two separate switches provided at the location, one of which 61 is merely an on-off switch and the other 211 a simple switch in parallel with switch 210, which initiates the signal seeking action. Closure of the latter mentioned switch will inaugurate signal seeking action in the same manner as the closure of switch 210. Relay 52 is deenergized during local operation and the two armatures 167 and 48 controlled thereby are in the lower position as shown in the drawings during such local control. However, when the remote on-off switch is operated switch 53 is also closed and relay coil 52 is energized to attract the two armatures 167 and 48 and move them to an upper position in which they engage contacts 166 and 50 respectively. When the tuner is in this condition movement of the member 184 in the control unit 110 to engage any of the contacts 172, 174, 176 or 178 changes the sensitivity of the receiver for normal signal seeking tuning to cause indexing on more or less stations as desired. At this time the original sensitivity control 38—42 is removed from the circuit by armature 48 moving upwardly, and the new remote sensitivity control replaces it when armature 48 closes contact with stationary contact 50. When, therefore, the remote signal seeking switch is closed, the set will signal tune in the same manner as it would from a local position, and the sensitivity is preset by switch 184.

If now it is desired to operate the tuner as a preset sequence remote control tuner, switch arm 184 is moved to engagement with contact 170 and any closure of the signal seeking switch at the remote point will now cause the tuner to move across the band, stopping in sequence at the location of each of the adjustable tabs 136, 202, 204, 206 and 208. The grounding circuit for the cathode section of the receiver is open except at such times as the indicating needle encounters any one of these presettable tabs. A sample grounding circuit may be traced as follows: line 24, line 56, line 112, member 182—184, contact 170, line 168, armature 167, contact 166, line 164, contact 162, armature for switch 192, line 198, trolley wire 132, adjustable tab 208, and when that is engaged by the needle 200, completes a circuit to ground. It will thus be obvious that each time the indicating needle encounters any one of the adjustable tabs, a cathode grounding circuit is completed and the tuner will stop on that station. Thus from a remote point either signal seeking tuning can be obtained and the sensitivity of the set adjusted, or by placing switch arm 184 on contact 170 the set can be made to sequence tune across the band on those preset positions.

In order to properly adjust the tabs to the correct position along the band, the operator has heretofore tuned in the station as previously described in the specification, and then moved the tab into alignment with the position of the pointer. Sometimes this has not been too accurate due to parallax, bent parts, etc. It is therefore felt that it would facilitate the setting of the position of these tabs if some indicating means could be provided to advise the operator when they were properly set. Figure 2 shows a system of audible indication for the proper location of these tabs. These sets are provided with a door covering the adjustable tabs, which is opened in order to obtain access to them. When the door is opened for obtaining adjustment, the indicating circuit can be energized to provide the desired action, and when closed the indicating portion of the circuit is deenergized, and it does not in any way affect normal operation of the receiver.

One manner in which indications might be obtained is to cause an audible signal at the correct in-tune position so that the operator would know when he had arrived at that location. Such an audible signal might be, for example, a muting of the set. Various other manners of obtaining indications, such as lights, etc., of course, come within the scope of my invention, and the present system is merely detailed for illustrative purposes.

Referring now more particularly to Figure 2, there is shown therein the same series of trolley wires 230, 232, 234, 236 and 238 over which there are adapted to slide the adjustable tab assemblies 240, 242, 244, 246, and 248 respectively. The indicating needle for the receiver is shown diagrammatically at 250 and is grounded. The various push button lock-in switches 252, 254, 256 258 and 260 are each shown in their nonenergized position. A bus line 262 is connected to one contact 264, 266, 268, 270, and 272 of each of the switches. The cathode string of the receiver is connected through line 274 to stationary contacts 276, 278, 280, 282, and 284 of each of the switches in spaced relation to those stationary contacts connected to bus line 262, and will be engaged when the switches are in their actuated position. Trolley line 230 is connected through line 286 with two spaced contacts 288 and 290 of the first switch 252. In like manner trolley line 232 is connected through line 292 with two spaced stationary contacts 294' and 296' of the second switch 254. The remaining trolley lines are connected in similar manner to switches 256, 258 and 260.

Bus 262 is connected to a stationary contact 294 of a switch 296, the latter movable member being connected directly through line 298 with the loud speaker 300 of the set. A further line 302 is connected between 298 and the output of the audio amplifier. Switch 296 is normally open when the set is operating in a conventional manner, but when the slide or door is open to obtain access for adjusting the tabs, this switch is closed. The receiver is tuned by ordinary signal seeking tuning to a station which it is desired to set up. The tab corresponding to the button which is to be set up (for instance tab 240) should now be aligned with the indicating needle and it is slid along its trolley 230 until it is in such alignment. When it encounters the end of the indicating needle 250, it will complete a grounding circuit across the speaker coil, which has been producing sounds from the station tuned in, and the set will be muted. At all other positions the set will play normally so when the operator moves the tab and mutes the set, he will know it is in its correct position. Upon closure of the door, switch 296 will be opened and the set will continue to operate normally. Each of the tabs may, of course, be set in the same manner, and when in the proper position will mute the set as an indication of the arrival at the proper point.

I claim:

1. In radio receiving apparatus having adjustable tuning means, driving means for the tuning means, control means to stop the driving means, means connected to the tuning means and movable simultaneously therewith over a prescribed path, a plurality of conductive means adjustably mounted along said path independently engageable by said means movable with said tuning means at various points, individual switching means connected to each said adjustable conductive means and commonly to the control means to selectively include only one of the adjustable conductive means in circuit with the control means so that only one station will be tuned in on each scanning of the frequency band, and remotely located switching means commonly connecting all of the adjustable conductive means to the control means for the tuning means to provide an energizing circuit at each point of contact between the means connected to the tuning means and any of the adjustable conductive means and sequence tuning of stations in scanning the band when the remotely located switching means is actuated, said remotely located switching means also rendering said individual switching means ineffective.

2. In radio receiving apparatus having tuning means, means for driving said tuning means to cause the receiver to scan a predetermined frequency band, means actuated by the appearance of an incoming signal to index the driving means to stop, a plurality of first switching means including adjustably positionable switching means along the tuner path connected to the indexing means to provide for energization of the indexing means only at each single predetermined selected locality, remote switching means connected commonly to the adjustably positioned switching means and means including the connection between said remote switching means and said adjustably positionable switching means to provide energization of said indexing means when said tuner arrives at any adjustable switching means to provide sequence tuning to the preset positions and to render said first switching means ineffective to energize said indexing means only at a single locality.

3. In a radio receiver having amplifying, detecting and tuning means, driving means for the tuning means, indexing means controlling the driving means connected to the receiver and actuated by the appearance of a tuned signal, a grounding circuit for the amplifier, switching means in the grounding circuit, a plurality of spaced adjustable contacts along a path, a part connected to said tuning means and movable therewith along said path engageable with said contacts to complete independent grounding circuits for the amplifier at each of the predetermined positions of the tuning means, local selective switching means for including any one of the contacts in the grounding circuit of the amplifier and simultaneously opening the first named switching means to tune the receiver to a desired one of a group of preselected stations and remote switching means including third switching means commonly connected to all of the selective switching means to provide, when closed, a grounding circuit for all so that the tuning means will stop sequentially at each preselected station in order as the tuner proceeds across the band when the single remote switch is closed, said remote switching means also including a master control means connected to the receiver to determine whether the local or remote switching means will control and lastly a fourth switching means in the remote switching means connected to the indexing means to provide conventional signal seeking tuning operation across the band.

4. In radio receiving apparatus having variable tuning means, means to move said tuning means to cause the apparatus to scan a predetermined frequency band, control index stopping means including a plurality of adjustable means controlling said means to move the tuning means to index and stop the same independently at a plurality of individual selected points, selective switching means connected in circuit with said adjustable means to determine which one is actuated and additional control means located at a remote point and electrically connected to all of the first named adjustable controlling means to cause all the adjustable means to be activated and stop the tuning means in sequential order at each of the points selected by the adjustment of the adjustable means and to simultaneously render the selective switching means ineffective.

5. In radio receiving apparatus having variable tuning means, driving means for the tuning means, a plurality of adjustable contact members located along the path of movement of a part of the tuning means and engageable thereby to complete energizing circuits for the receiving apparatus, indexing and stopping means connected to the driving means and to the receiving apparatus and actuated upon receipt of an incoming signal in the apparatus, switching means selectively connecting individual contacts independently to the apparatus to complete energizing circuits for the same so that the tuning means will index to one desired station, and a single remote named switching means connected to the apparatus to the first switching means to commonly complete energizing circuits for all of the adjustable contacts simultaneously so that the tuning will be indexed in sequence at each of the preset stations as the tuning means is driven across the band and the second switching means rendered ineffective.

6. In radio receiving means having tuning means and a loud speaker, means for adjusting the tuning means to tune in desired stations, a plurality of adjustable means along a path to position to index the adjustable tuning means to tune to preset stations, means movable with the tuning means contacting said adjustable means, conductive means connecting any of said adjustable means to the loud speaker to give an indication of correct positioning and switching means in the conductive means to disconnect the speaker.

7. In radio receiving apparatus, adjustable tuning means, driving means for said tuning means, signal actuated indexing means for controlling said driving means connected to said apparatus, a plurality of adjustable contact means mounted along a path electrically connected to the receiving apparatus, means connected to the tuning means and simultaneously movable therewith along said path to engage said contacts and periodically complete energizing circuits for the signal actuated indexing means to provide index on preset stations, a loud speaker for the receiver, conductive means connecting said adjustable contacts and said speaker to indicate correct location of a contact to tune in a desired station and switching means to disconnect said speaker from the contacts.

8. In radio receiving apparatus having amplifying and detecting means, means for tuning said amplifying means over a predetermined band of frequencies, driving means connected to the tuning means to drive the same, indexing means actuated upon receipt of an incoming signal in the apparatus connected to the driving means to stop the tuning means upon a station, a plurality of means for varying the sensitivity of the amplifying means connected to said amplifying means, switching means connected to said sensitivity varying means to determine which shall control the amplifier, a plurality of adjustably positionable switching means actuated upon movement of the tuning means as it is driven, circuit means connecting each said adjustably positionable switching means independently to the amplifying means to control energization of the amplifying means, and additional switching means commonly connected to the adjustably positionable switching means to provide a control circuit at all adjustably positioned locations when closed and located at a point remote from the apparatus together with one of the sensitivity varying means so that the sensitivity of the apparatus may be controlled from a remote point and the tuner may be indexed to certain pre-set positions from said point.

9. In radio receiving apparatus having amplifying and detecting means, means for tuning the amplifying means over a given band of frequencies, driving means connected to the tuning means to drive the same, indexing means connected to the driving means and actuated upon the receipt of an incoming signal to stop said tuner upon a given station, means to vary the sensitivity of said amplifying means, switching means to initiate movement of said driving means to move said tuning means, a plurality of adjustable members mounted along a path, a part connected to said tuning means movable along said path as the tuner moves and engaging said members to form switching means therewith, circuit means connecting said amplifying means and the adjustable members to control energization of the amplifying means, a second sensitivity control means and control switching means located at a remote point, second circuit means connected to the amplifying means, the adjustably positionable members, to the second sensitivity control means, and control switching means, said control switching means in said second circuit means providing for remote control of the apparatus to change the sensitivity and index the tuner to the pre-set stations and a master switching means in said second circuit means to determine whether local or remote control of the apparatus is obtained.

10. In radio receiving means having adjustable tuning means for tuning the receiving means over a predetermined frequency spectrum, driving means connected to the adjustable tuning means to drive the same, indexing stopping means connected to the receiver and operatively associated with the driving means in which a control signal is generated upon the tuning in of a station to cause the driving means to stop on that station, conductive means connected to the receiver and to ground to vary the sensitivity of said receiver, a plurality of first switching means adjustably mounted along the path of tuner travel connected in said conductive means and actuated at each location to complete an independent circuit, a second selective switching means in series with each first switching means to select at which one locale it is desired to have the tuner stop of any in the entire band, a third switching means having a common connection to the second selective switching means and said conductive means so that when the third switching means is closed the closure of any of the first switching means will complete an energizing circuit for the receiver so that an indexing signal may be applied to provide sequence tuning of preselected stations and render ineffective said second switching means to stop said tuning means at only one locale in the entire band.

11. In radio receiving means having adjustable tuning means for tuning the receiving means over a predetermined frequency spectrum, driving means connected to the adjustable tuning means to drive the same, indexing stopping means connected to the receiver and operatively associated with the driving means in which a control signal is generated upon the tuning in of a station to cause the driving means to stop on that station, conductive means providing a plurality of parallel paths from the receiving means to ground to change the sensitivity of the receiving means, a first switching means in each path formed of a conductive body adjustable along a physical path and a second conductive part secured to the tuning means and movable therewith along said physical path and completing a circuit when it engages the adjustable conductive body in that path and a second switching means in each path to select which of the adjustable means will complete the grounding circuit to select one station in each movement of the tuner over the entire band and a third switching means commonly connected to the first switching means and to said conductive means to complete a grounding circuit for the receiver at the position of each adjustable conductive body when the third switching means is closed to provide sequential station selection as the tuner moves over the complete band and to render said second switching means ineffective to stop said tuning means at only one locale in the entire band.

References Cited in the file of this patent

UNITED STATES PATENTS

| | | |
|---|---|---|
| 2,174,566 | Case | Oct. 3, 1939 |
| 2,192,313 | Huth et al. | Mar. 5, 1940 |
| 2,316,899 | Stolzenberg | Apr. 20, 1943 |
| 2,321,699 | O'Brien | June 15, 1943 |
| 2,501,003 | Pifer | Mar. 21, 1950 |
| 2,744,193 | Schwarz | May 1, 1956 |
| 2,751,503 | Schwarz | June 19, 1956 |